(12) United States Patent
Suzuki et al.

(10) Patent No.: US 10,505,243 B2
(45) Date of Patent: Dec. 10, 2019

(54) BALUN

(71) Applicant: TDK CORPORATION, Tokyo (JP)

(72) Inventors: Hiroya Suzuki, Tokyo (JP); Yuta Ashida, Tokyo (JP); Noriaki Ootsuka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 42 days.

(21) Appl. No.: 15/786,111

(22) Filed: Oct. 17, 2017

(65) Prior Publication Data

US 2018/0123202 A1 May 3, 2018

(30) Foreign Application Priority Data

Oct. 28, 2016 (JP) .................................. 2016-211191

(51) Int. Cl.
| | |
|---|---|
| *H01P 5/10* | (2006.01) |
| *H03H 7/42* | (2006.01) |
| *H01P 1/02* | (2006.01) |
| *H01Q 5/335* | (2015.01) |
| *H02M 7/48* | (2007.01) |
| *H03B 5/12* | (2006.01) |

(52) U.S. Cl.
CPC ............. *H01P 1/022* (2013.01); *H01Q 5/335* (2015.01); *H02M 2007/4815* (2013.01); *H03B 5/1265* (2013.01)

(58) Field of Classification Search
CPC ................ H01P 5/10; H01P 3/08; H03H 7/42
USPC ...................................................... 333/26, 25
See application file for complete search history.

(56) References Cited

U.S. PATENT DOCUMENTS

| 5,644,272 A * | 7/1997 | Dabrowski ............... H01P 5/10 333/238 |
| 7,215,218 B2 * | 5/2007 | Burns ....................... H01P 5/10 333/26 |
| 9,035,717 B2 * | 5/2015 | Tanaka ..................... H03H 7/42 333/109 |
| 2006/0061430 A1 | 3/2006 | Lee et al. |

FOREIGN PATENT DOCUMENTS

| JP | 2002-177404 A | 6/2002 |
| JP | 2002177404 A * | 6/2002 |

OTHER PUBLICATIONS

Translation of Sep. 27, 2019 Office Action issued in Chinese Patent Application No. 201711020702.6.

* cited by examiner

*Primary Examiner* — Dean O Takaoka
(74) *Attorney, Agent, or Firm* — Oliff PLC

(57) ABSTRACT

A balun includes an unbalanced port, a first balanced port, a second balanced port, a main line, a subline, a capacitor, and an impedance matching section. The subline is configured to be electromagnetically coupled to the main line. The main line has a first end and a second end opposite to each other. The subline has a first end and a second end opposite to each other. The capacitor is provided between the first end of the main line and the unbalanced port. The impedance matching section is provided between the second end of the subline and the second balanced port. The second end of the main line is connected to a ground. The first end of the subline is connected to the first balanced port.

11 Claims, 15 Drawing Sheets

BALUN

BACKGROUND OF THE INVENTION

1. Field of the Invention

The present invention relates to a wideband capable balun.

2. Description of the Related Art

Baluns for converting between balanced and unbalanced signals are one of electronic components for use in transmission/reception circuits of wireless communication apparatuses such as communication apparatuses for television broadcasting, cellular phones, and wireless LAN communication apparatuses. A balun includes an unbalanced port for input and output of an unbalanced signal and two balanced ports for input and output of two balanced element signals constituting a balanced signal.

It is required of the baluns to exhibit a good amplitude balance characteristic and a good phase balance characteristic over a wide frequency band. The good amplitude balance characteristic means that the two balanced element signals outputted from the two balanced ports upon input of an unbalanced signal to the unbalanced port are different in amplitude from each other by approximately zero. The good phase balance characteristic means that the two balanced element signals outputted from the two balanced ports upon input of an unbalanced signal to the unbalanced port are different in phase from each other by approximately 180 degrees.

Conventional baluns capable of being used over relatively wide frequency bands include Marchand baluns, an example of which is disclosed in U.S. Patent Application Publication No. 2006/0061430 A1.

The recent advances in television broadcasting technologies, mobile communication technologies and the like have extended the usable frequency bands of wireless communication apparatuses. It is thus required that baluns for use in the wireless communication apparatuses be capable of being used over a wider frequency band.

SUMMARY OF THE INVENTION

It is an object of the present invention to provide a balun capable of being used over a wide frequency band.

A balun of the present invention includes an unbalanced port, a first balanced port, a second balanced port, a main line, a subline, a first capacitor, and an impedance matching section. The main line has a first end and a second end opposite to each other. The subline is configured to be electromagnetically coupled to the main line and has a first end and a second end opposite to each other. The first capacitor is provided between the first end of the main line and the unbalanced port. The impedance matching section is provided between the second end of the subline and the second balanced port. The second end of the main line is connected to a ground. The first end of the subline is connected to the first balanced port.

In the balun of the present invention, the impedance matching section may be an LC circuit including an inductor and a second capacitor.

In the balun of the present invention, the impedance matching section may include a first path connecting the second end of the subline and the second balanced port, and a second path connecting the first path and the ground. The first path may include an inductor. The second path may include a second capacitor.

When the impedance matching section includes the first path and the second path, the first path may include a first inductance element and a second inductance element having their respective inductances and configured to be inductively coupled to each other. Each of the first and second inductance elements may have a first end and a second end opposite to each other. The first end of the first inductance element is connected to the second end of the subline. The first end of the second inductance element is connected to the second balanced port. The second end of the first inductance element and the second end of the second inductance element are connected to each other, and connected to the ground via the second path. The second path includes a second capacitor.

The first inductance element may be a first line, and the second inductance element may be a second line. In such a case, the first line and the second line may be configured to be capacitively coupled to each other. The first line may include a first line portion. The second line may include a second line portion opposed to the first line portion. The first line portion has a first edge and a second edge opposite to each other, the first edge of the first line portion being closest to the second end of the subline in terms of circuit configuration. The second line portion has a first edge and a second edge opposite to each other, the first edge of the second line portion being closest to the second balanced port in terms of circuit configuration. The first edge of the second line portion is physically closer to the second edge of the first line portion than to any other part of the first line portion. The second edge of the second line portion is physically closer to the first edge of the first line portion than to any other part of the first line portion.

The balun of the present invention may further include a multilayer structure for integrating the unbalanced port, the first and second balanced ports, the main line, the subline, the first capacitor and the impedance matching section. The multilayer structure includes a plurality of dielectric layers and a plurality of conductor layers stacked on each other.

The balun of the present invention achieves a wider usable frequency band than that of a Marchand balun by utilizing the resonance of a series resonant circuit formed by the main line and the first capacitor. The present invention thus provides a balun capable of being used over a wide frequency band.

Other and further objects, features and advantages of the invention will appear more fully from the following description.

DETAILED DESCRIPTION OF THE PREFERRED EMBODIMENT

Figure 1:
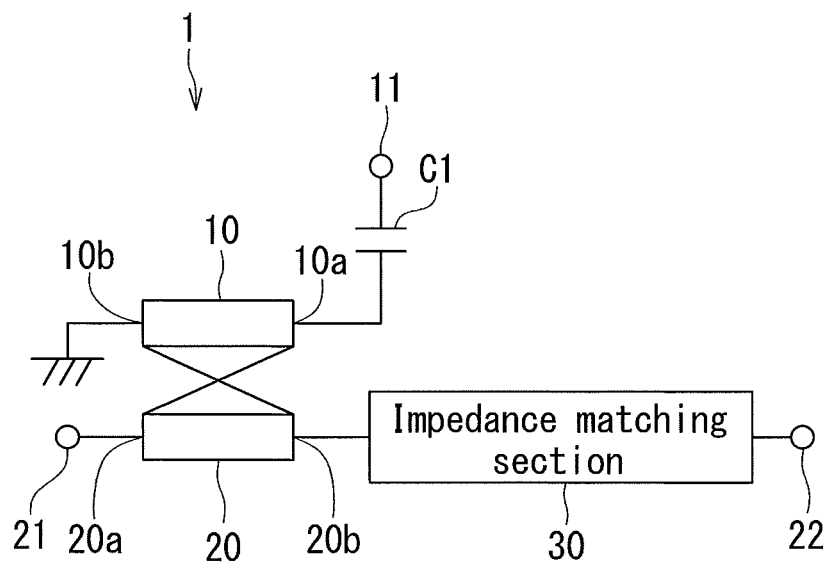
FIG. 1 is a circuit diagram illustrating the circuit configuration of a balun according to an embodiment of the invention.

An embodiment of the present invention will now be described in detail with reference to the drawings. First, reference is made to FIG. 1 to describe the circuit configuration of a balun according to the embodiment of the invention. FIG. 1 illustrates the circuit configuration of the balun according to the embodiment. As shown in FIG. 1, the balun 1 includes an unbalanced port 11, a first balanced port 21, a second balanced port 22, a main line 10, a subline 20, a first capacitor C1, and an impedance matching section 30. The subline 20 is configured to be electromagnetically coupled to the main line 10.

The main line 10 has a first end 10a and a second end 10b opposite to each other. The subline 20 has a first end 20a and a second end 20b opposite to each other. The first capacitor C1 is provided between the first end 10a of the main line 10 and the unbalanced port 11. The impedance matching section 30 is provided between the second end 20b of the subline 20 and the second balanced port 22. The second end 10b of the main line 10 is connected to the ground. The first end 20a of the subline 20 is connected to the first balanced port 21.

The impedance matching section 30 is a circuit for performing impedance matching so that the impedance of the balun 1 as viewed from the first and second balanced ports 21 and 22 has a value equal or nearly equal to the value of a characteristic impedance of a balanced line connected to the first and second balanced ports 21 and 22. The impedance matching section 30 causes a change in the phase of a signal passing through the impedance matching section 30 so as to provide a good phase balance characteristic in the usable frequency band of the balun 1.

A first to a fourth example of circuit configuration of the impedance matching section 30 will be described with reference to FIG. 2 to FIG. 5. The first example shown in FIG. 2 and the second example shown in FIG. 3 will be described first. In the first and second examples, the impedance matching section 30 includes a first path 31 connecting the second end 20b of the subline 20 and the second balanced port 22, and a second path 32 connecting the first path 31 and the ground. The first path 31 includes a first inductance element L1 and a second inductance element L2 having their respective inductances and configured to be inductively coupled to each other. Each of the first and second inductance elements L1 and L2 has a first end and a second end opposite to each other. The first end and the second end of the first inductance element L1 will be denoted by L1a and L1b, respectively. The first end and the second end of the second inductance element L2 will be denoted by L2a and L2b, respectively.

Figure 2:
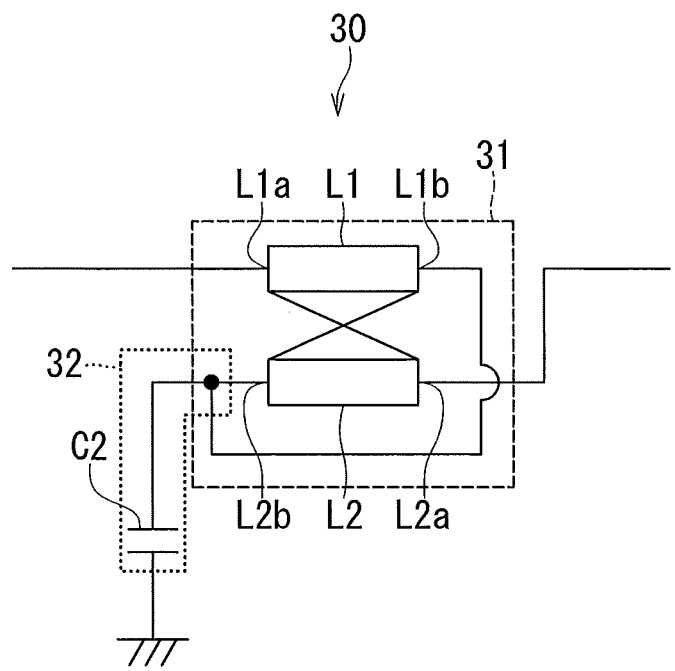
FIG. 2 is a circuit diagram illustrating a first example of circuit configuration of an impedance matching section of the balun of FIG. 1.
Figure 3:
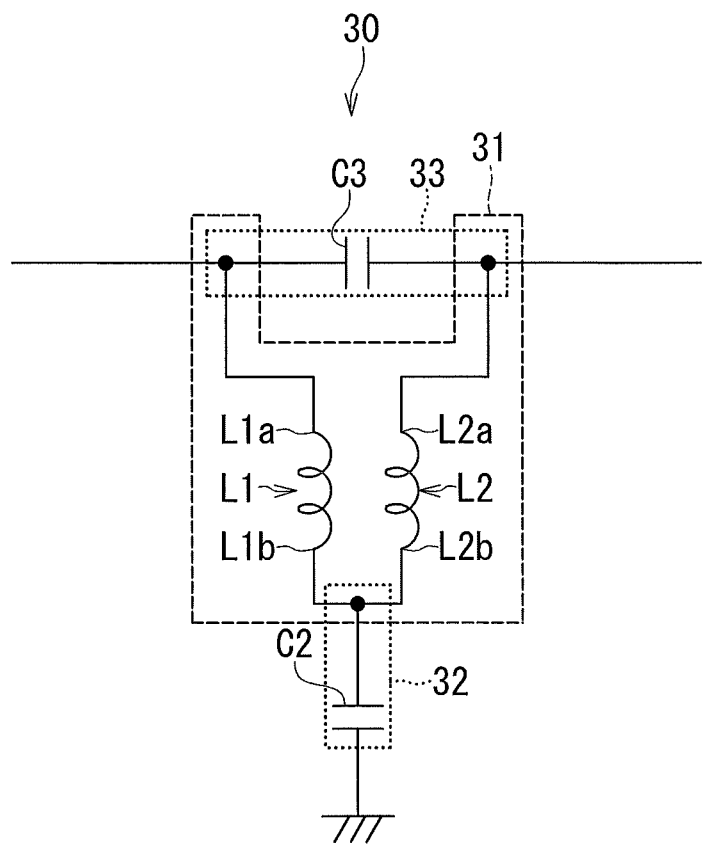
FIG. 3 is a circuit diagram illustrating a second example of circuit configuration of the impedance matching section of the balun of FIG. 1.

The first end L1a of the first inductance element L1 is connected to the second end 20b of the subline 20. The first end L2a of the second inductance element L2 is connected to the second balanced port 22. The second end L1b of the first inductance element L1 and the second end L2b of the second inductance element L2 are connected to each other, and connected to the ground via the second path 32. As shown in FIG. 2 and FIG. 3, the second path 32 includes a second capacitor C2.

The configuration of the first inductance element L1 and the second inductance element L2 will now be described in detail. Each of the first and second inductance elements L1 and L2 may be a line or an inductor which is a lumped constant element. The first example shown in FIG. 2 is an example in which each of the first and second inductance elements L1 and L2 is a line. The second example shown in FIG. 3 is an example in which each of the first and second inductance elements L1 and L2 is an inductor.

In the first example, the first inductance element L1 is taken as a first line, and the second inductance element L2 is taken as a second line. The first line and the second line are configured to be at least inductively coupled to each other. The first line and the second line may be further configured to be capacitively coupled to each other such that the capacitance between the first line and the second line is distributed continuously along the first and second lines, like a distributed constant circuit.

In the first example, the first line may include a first line portion, and the second line may include a second line portion opposed to the first line portion. The first line portion has a first edge and a second edge opposite to each other. The first edge of the first line portion is closest to the second end 20b of the subline 20 in terms of circuit configuration. The second line portion has a first edge and a second edge opposite to each other. The first edge of the second line portion is closest to the second balanced port 22 in terms of circuit configuration. The first edge of the second line portion is physically closer to the second edge of the first line portion than to any other part of the first line portion. The second edge of the second line portion is physically closer to the first edge of the first line portion than to any other part of the first line portion. The first and second line portions will be described in more detail later.

In the second example, as shown in FIG. 3, the first inductance element L1 and the second inductance element L2 may be configured to be capacitively coupled to each other via a capacitor which is a lumped constant element. To be more specific, the impedance matching section 30 shown in FIG. 3 may further include a third path 33 connecting the first end L1a of the first inductance element L1 and the first end L2a of the second inductance element L2. The third path 33 includes a third capacitor C3 for establishing capacitive coupling between the first inductance element L1 and the second inductance element L2.

Figure 4:
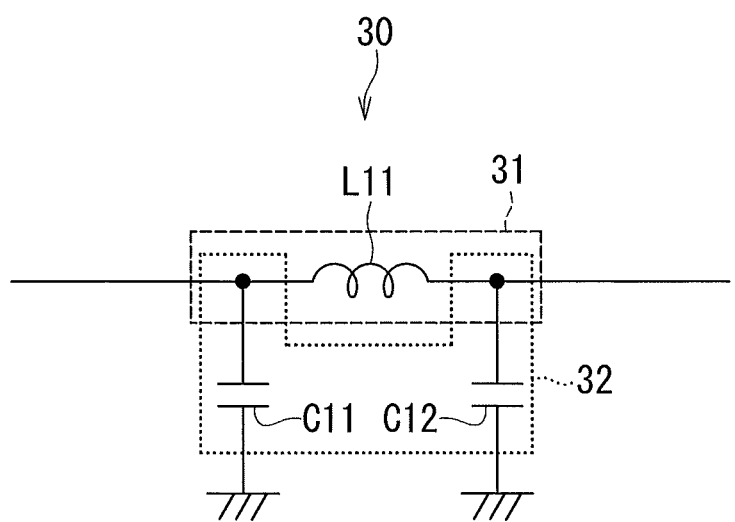
FIG. 4 is a circuit diagram illustrating a third example of circuit configuration of the impedance matching section of the balun of FIG. 1.

The third example shown in FIG. 4 will now be described. In the third example, the impedance matching section 30 is an LC circuit including an inductor L11 and a second capacitor C11. The circuit configuration of the third example is that of a low-pass filter, in particular. In the third example, the impedance matching section 30 includes a first path 31 connecting the second end 20b of the subline 20 and the second balanced port 22, and a second path 32 connecting the first path 31 and the ground, as in the first and second examples. In the third example, the first path 31 includes the inductor L11. The second path 32 includes the second capacitor C11.

In the third example, the second path 32 further includes a third capacitor C12. The second capacitor C11 is provided between one end of the inductor L11 and the ground. The third capacitor C12 is provided between the other end of the inductor L11 and the ground.

Figure 5:
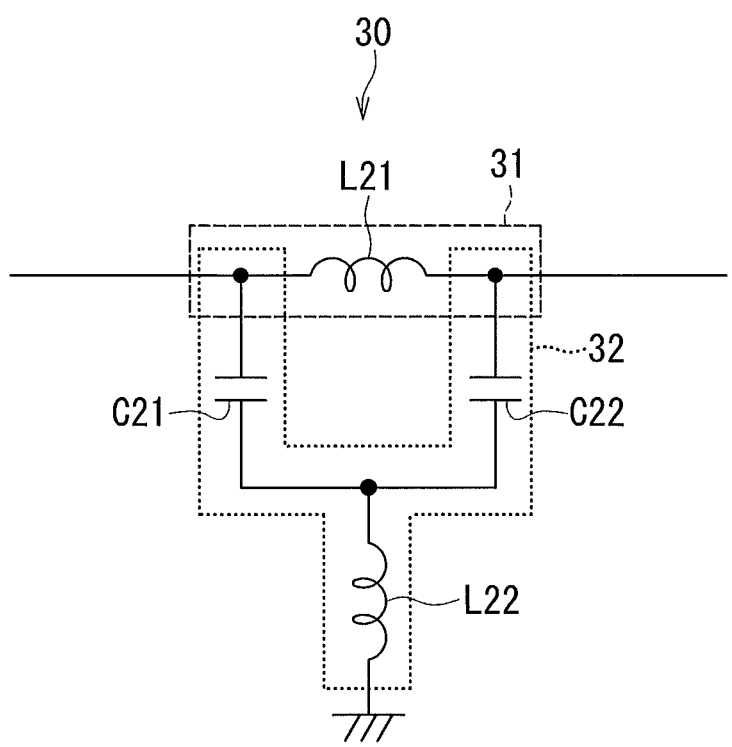
FIG. 5 is a circuit diagram illustrating a fourth example of circuit configuration of the impedance matching section of the balun of FIG. 1.

The fourth example shown in FIG. 5 will now be described. In the fourth example, the impedance matching section 30 is an LC circuit including an inductor L21 and a second capacitor C21. In the fourth example, the impedance matching section 30 includes a first path 31 connecting the second end 20b of the subline 20 and the second balanced port 22, and a second path 32 connecting the first path 31 and the ground, as in the first to third examples. In the fourth example, the first path 31 includes the inductor L21. The second path 32 includes the second capacitor C21.

In the fourth example, the second path 32 further includes an inductor L22 connected in series to the second capacitor C21. The second capacitor C21 is provided between one end of the inductor L21 and one end of the inductor L22. The other end of the inductor L22 is connected to the ground. In the fourth example, the second path 32 further includes a third capacitor C22 provided between the other end of the inductor L21 and the one end of the inductor L22.

Figure 6:
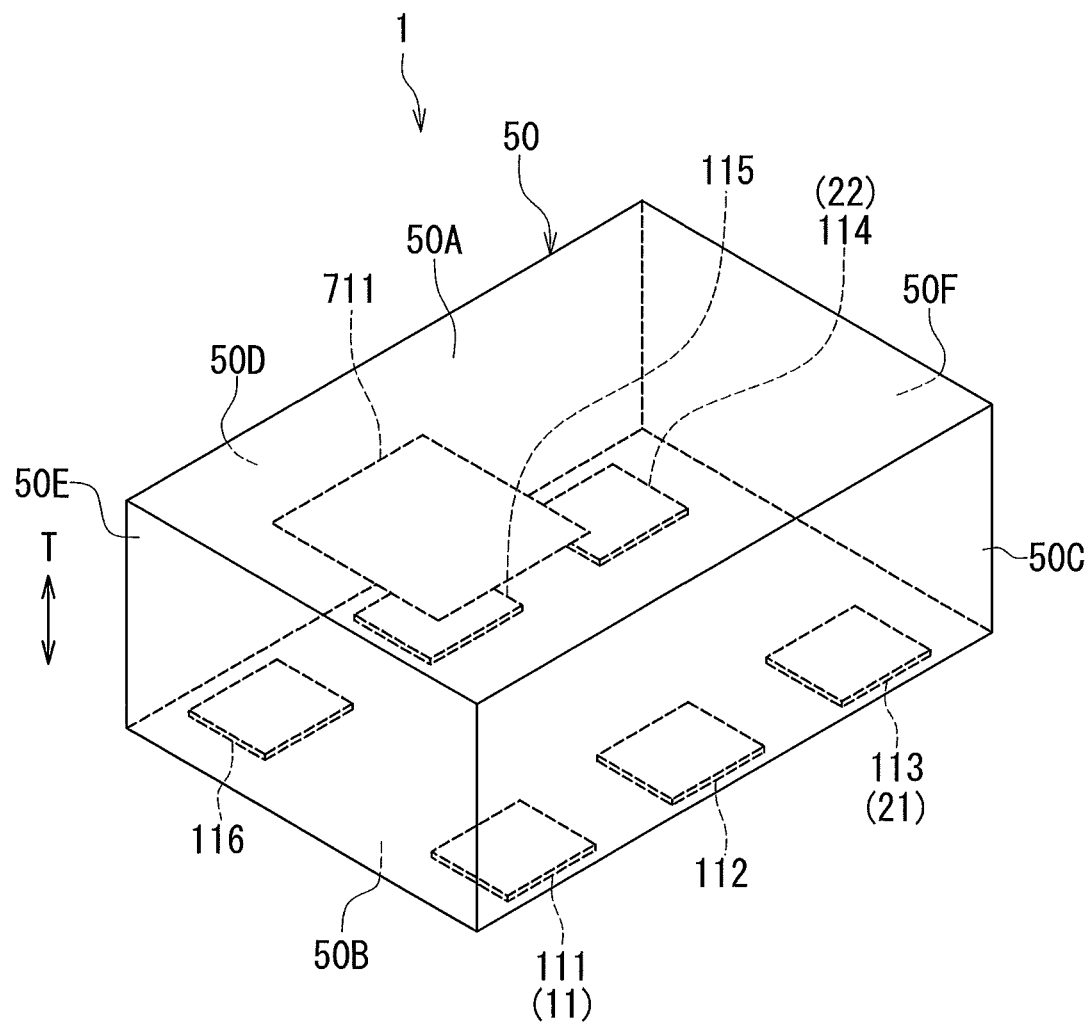
FIG. 6 is a perspective view of the balun of the embodiment of the invention.

An example of the structure of the balun 1 will now be described. The example to be described here is where the impedance matching section 30 of the balun 1 has the circuit configuration of the first example shown in FIG. 2. FIG. 6 is a perspective view of the balun 1. The balun 1 of FIG. 6 includes a multilayer structure 50 for integrating the unbalanced port 11, the first and second balanced ports 21 and 22, the main line 10, the subline 20, the first capacitor C1 and the impedance matching section 30. As will be described in detail later, the multilayer structure 50 includes a plurality of dielectric layers and a plurality of conductor layers stacked on each other.

The multilayer structure 50 is shaped like a rectangular solid and has a periphery. The periphery of the multilayer structure 50 includes a top surface 50A, a bottom surface 50B, and four side surfaces 50C, 50D, 50E and 50F. The top surface 50A and the bottom surface 50B are opposite each other. The side surfaces 50C and 50D are opposite each other. The side surfaces 50E and 50F are opposite each other. The side surfaces 50C to 50F are perpendicular to the top surface 50A and the bottom surface 50B. In the multilayer structure 50, the dielectric layers and the conductor layers are stacked in the direction perpendicular to the top surface 50A and the bottom surface 50B. This direction will be referred to as the stacking direction. The stacking direction is shown by the arrow T in FIG. 6. The top surface 50A and the bottom surface 50B are located at opposite ends in the stacking direction T.

The balun 1 of FIG. 6 includes first to sixth terminals 111, 112, 113, 114, 115 and 116. The first, third and fourth terminals 111, 113 and 114 respectively correspond to the unbalanced port 11, the first balanced port 21 and the second balanced port 22 of FIG. 1. The second, fifth and sixth terminals 112, 115 and 116 are connected to the ground. The terminals 111 to 116 are located on the bottom surface 50B of the multilayer structure 50.

Figure 7:
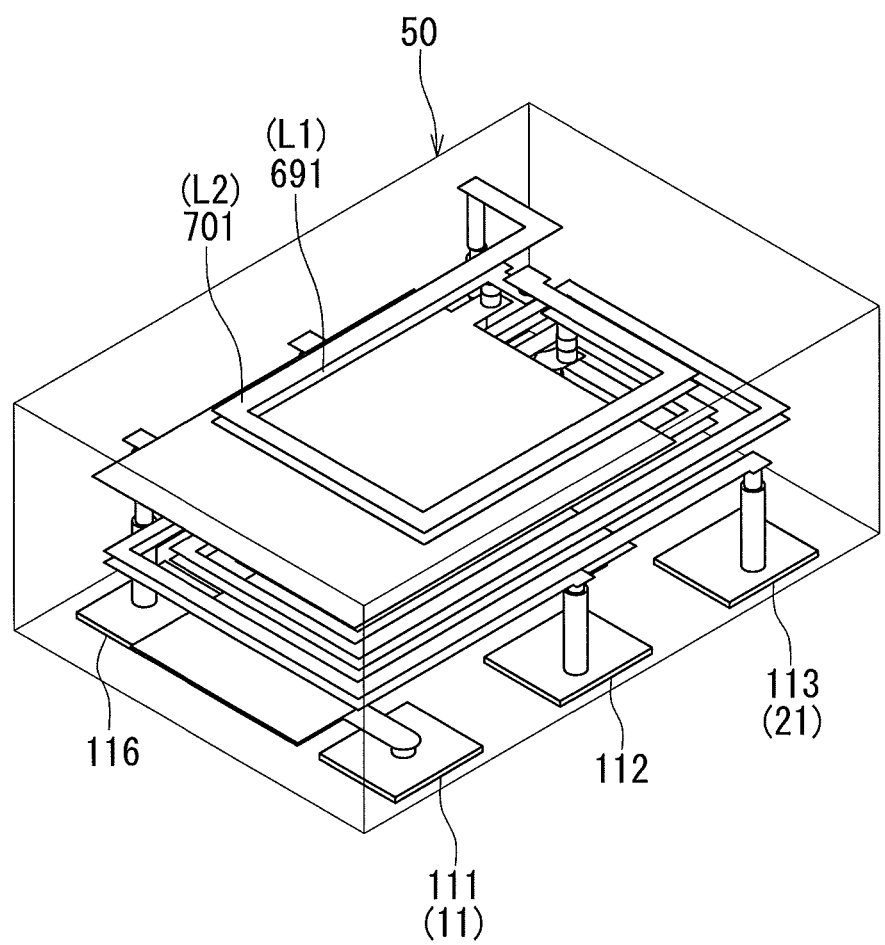
FIG. 7 is a perspective view illustrating the interior of a multilayer structure of the balun of FIG. 6.
Figure 8:
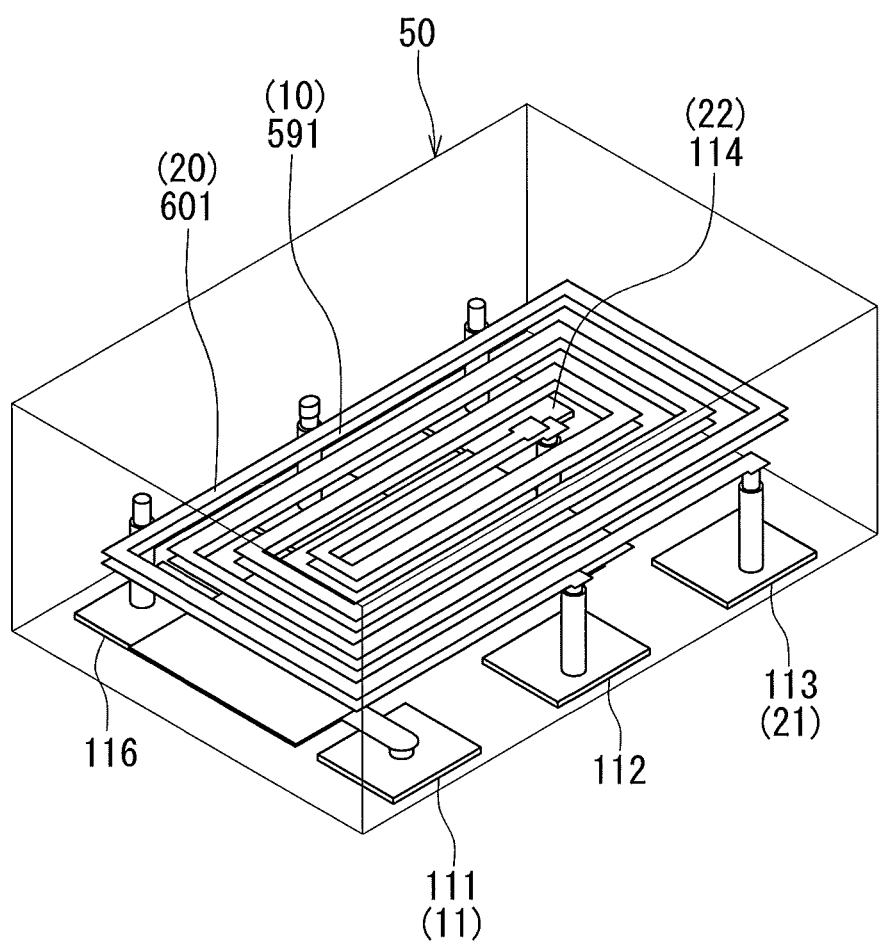
FIG. 8 is a perspective view illustrating a part of the interior of the multilayer structure of the balun of FIG. 6.
Figure 9A:
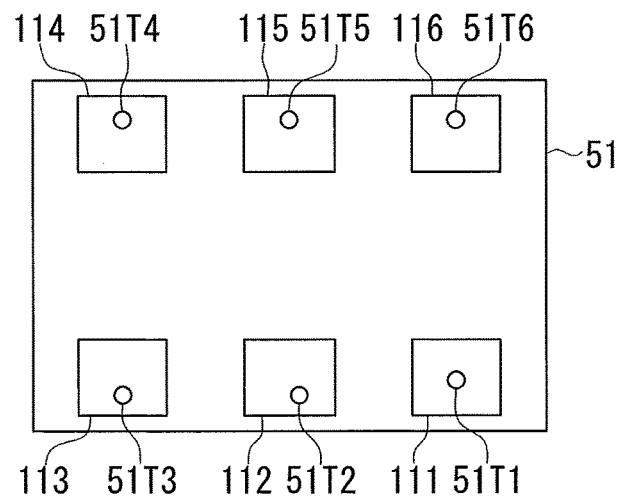
FIG. 9A is an explanatory diagram illustrating a patterned surface of a first dielectric layer of the multilayer structure of the balun of FIG. 6.
Figure 9B:
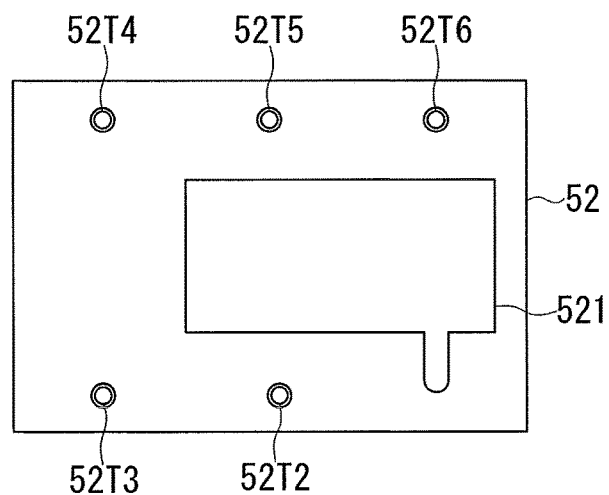
FIG. 9B is an explanatory diagram illustrating a patterned surface of a second dielectric layer of the multilayer structure of the balun of FIG. 6.
Figure 9C:
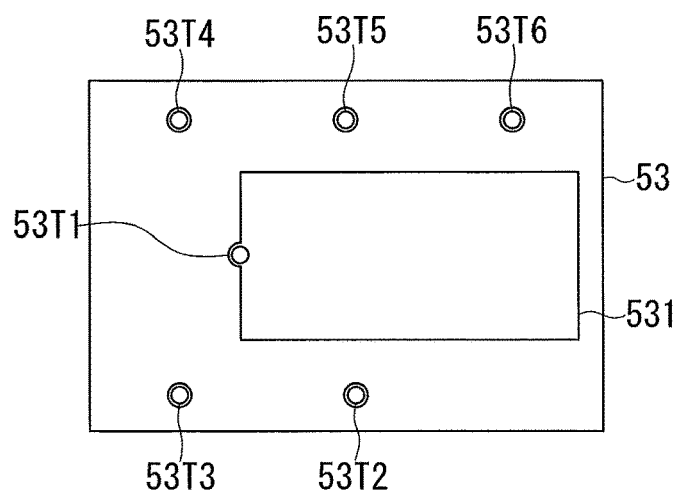
FIG. 9C is an explanatory diagram illustrating a patterned surface of a third dielectric layer of the multilayer structure of the balun of FIG. 6.
Figure 10A:
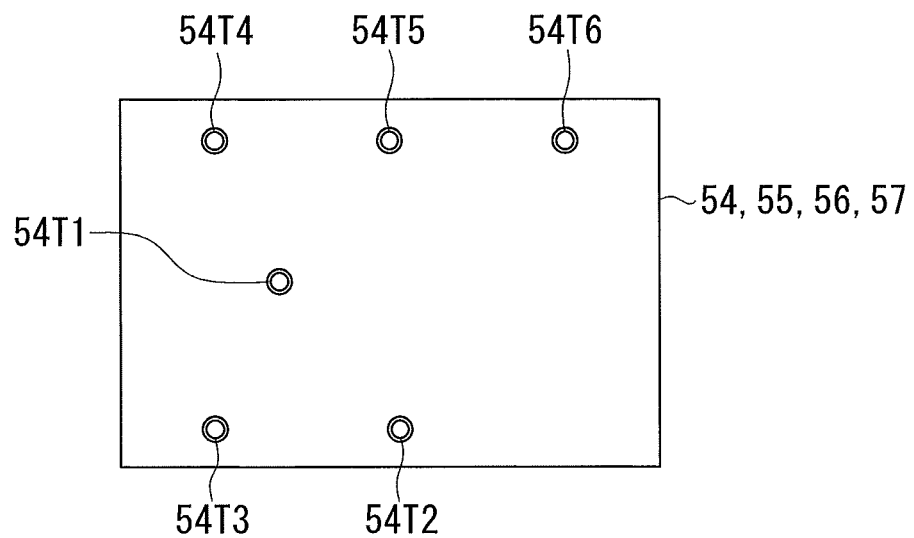
FIG. 10A is an explanatory diagram illustrating a patterned surface of each of a fourth to a seventh dielectric layer of the multilayer structure of the balun of FIG. 6.
Figure 10B:
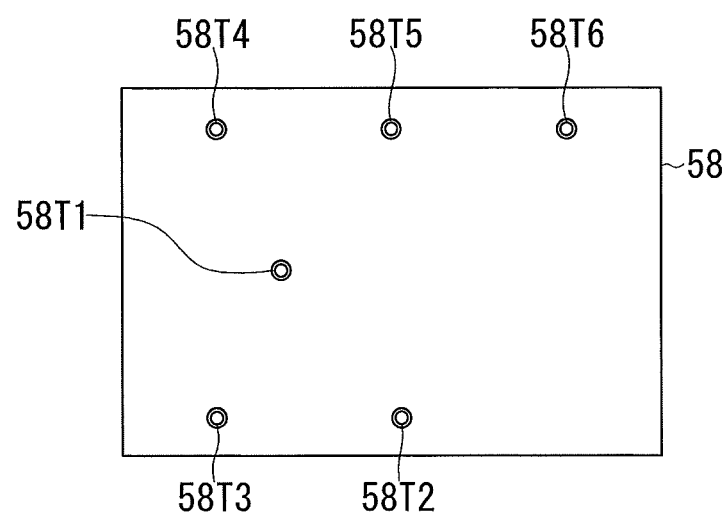
FIG. 10B is an explanatory diagram illustrating a patterned surface of an eighth dielectric layer of the multilayer structure of the balun of FIG. 6.
Figure 11A:
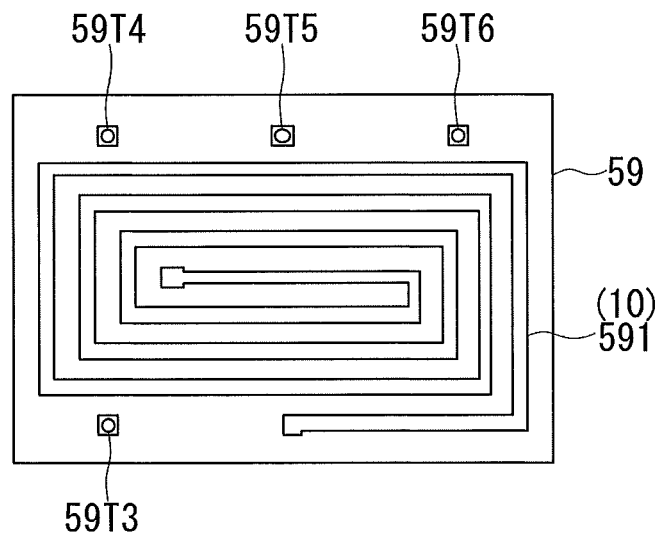
FIG. 11A is an explanatory diagram illustrating a patterned surface of a ninth dielectric layer of the multilayer structure of the balun of FIG. 6.
Figure 11B:
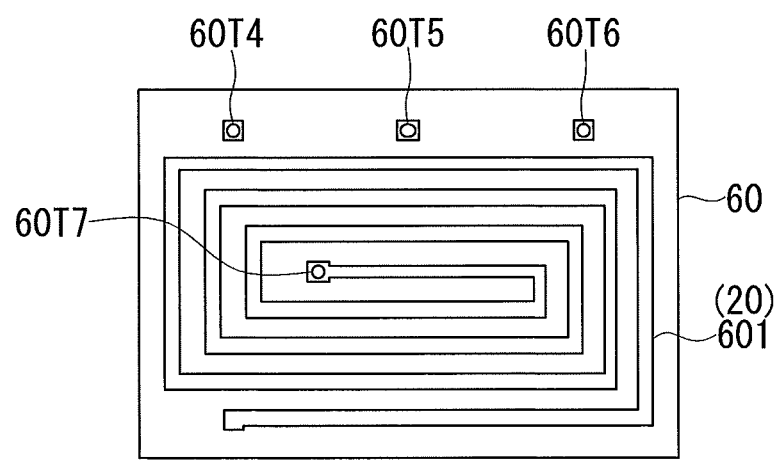
FIG. 11B is an explanatory diagram illustrating a patterned surface of a tenth dielectric layer of the multilayer structure of the balun of FIG. 6.
Figure 12A:
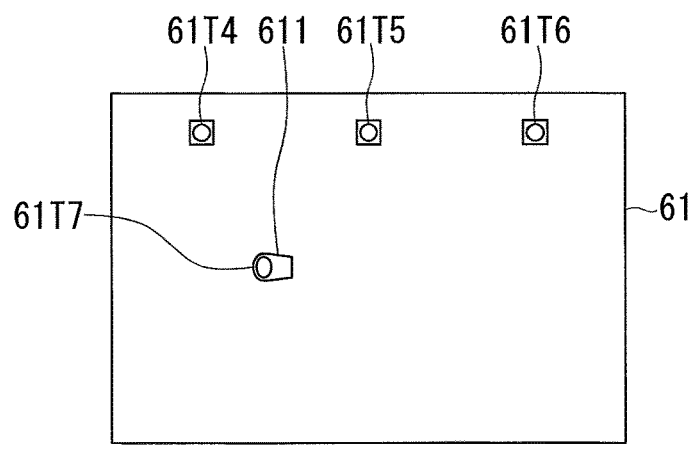
FIG. 12A is an explanatory diagram illustrating a patterned surface of an eleventh dielectric layer of the multilayer structure of the balun of FIG. 6.
Figure 12B:
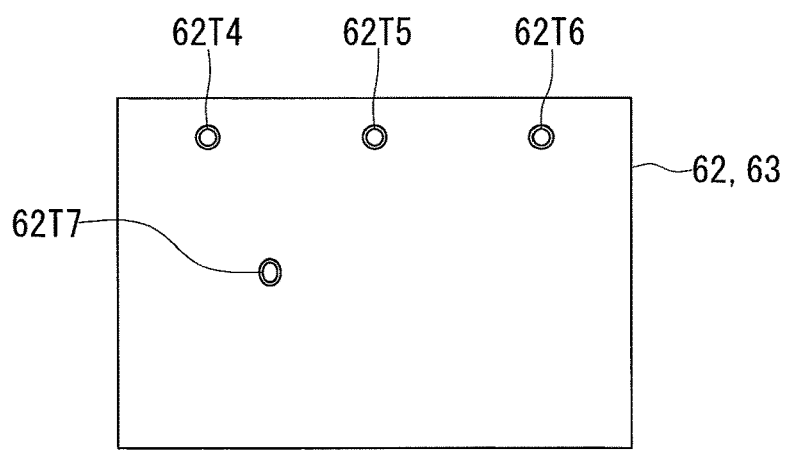
FIG. 12B is an explanatory diagram illustrating a patterned surface of each of a twelfth and a thirteenth dielectric layer of the multilayer structure of the balun of FIG. 6.
Figure 12C:
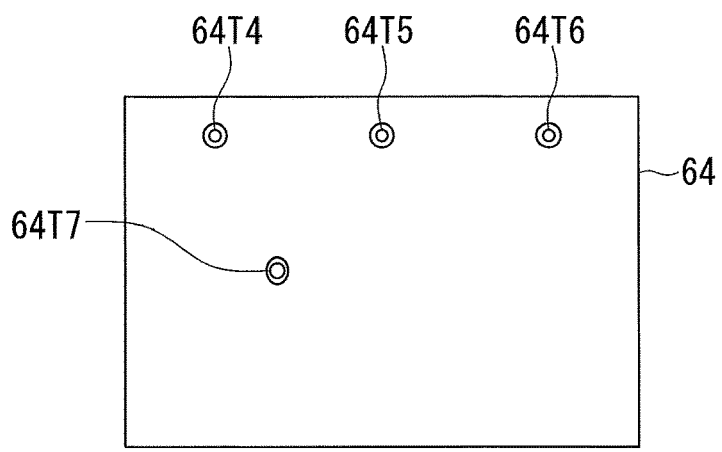
FIG. 12C is an explanatory diagram illustrating a patterned surface of a fourteenth dielectric layer of the multilayer structure of the balun of FIG. 6.
Figure 13A:
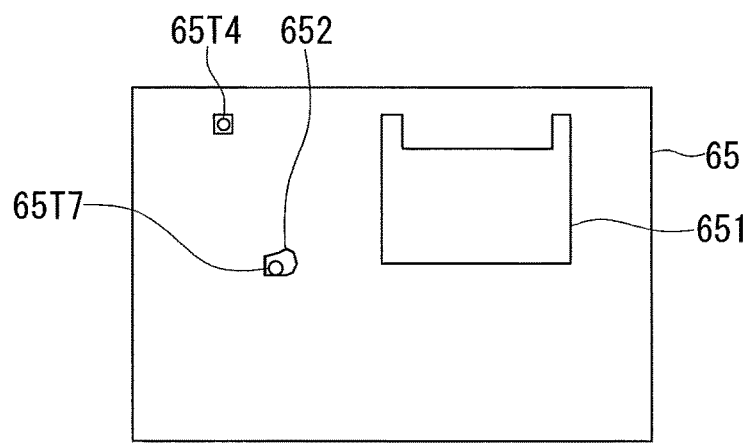
FIG. 13A is an explanatory diagram illustrating a patterned surface of a fifteenth dielectric layer of the multilayer structure of the balun of FIG. 6.
Figure 13B:
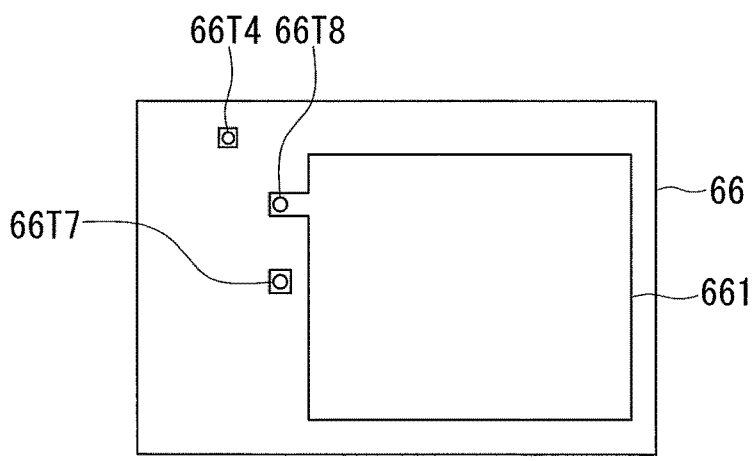
FIG. 13B is an explanatory diagram illustrating a patterned surface of a sixteenth dielectric layer of the multilayer structure of the balun of FIG. 6.
Figure 13C:
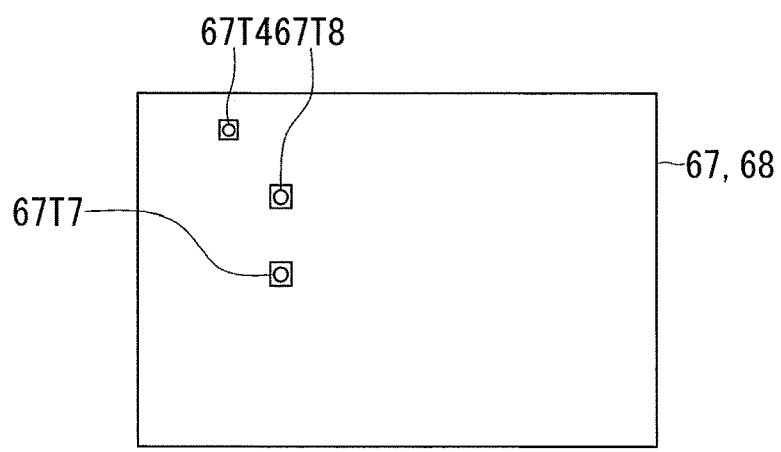
FIG. 13C is an explanatory diagram illustrating a patterned surface of each of a seventeenth and an eighteenth dielectric layer of the multilayer structure of the balun of FIG. 6.
Figure 14A:
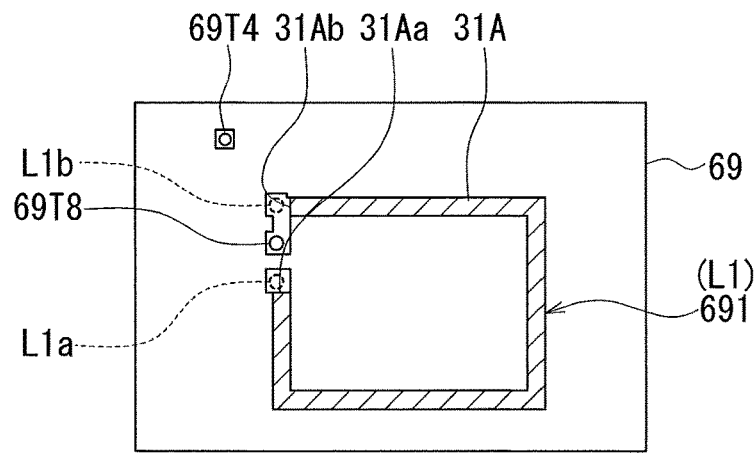
FIG. 14A is an explanatory diagram illustrating a patterned surface of a nineteenth dielectric layer of the multilayer structure of the balun of FIG. 6.
Figure 14B:
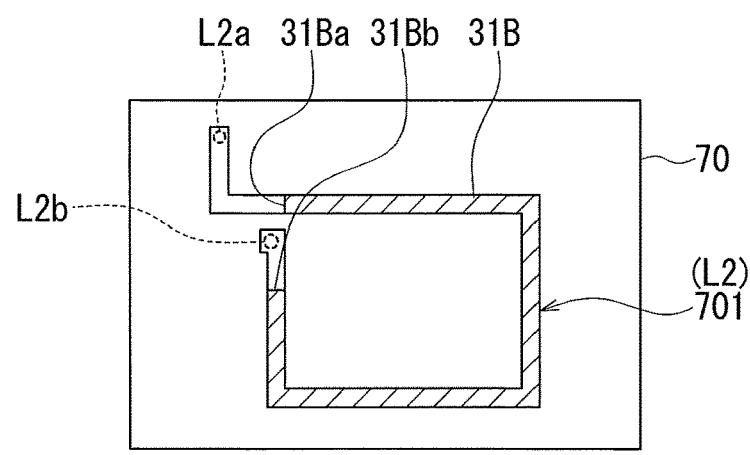
FIG. 14B is an explanatory diagram illustrating a patterned surface of a twentieth dielectric layer of the multilayer structure of the balun of FIG. 6.
Figure 14C:
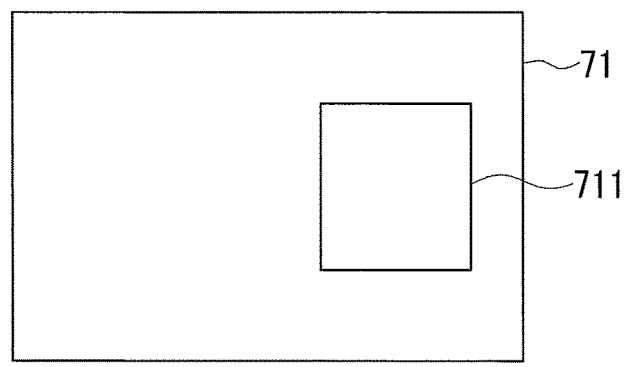
FIG. 14C is an explanatory diagram illustrating a patterned surface of a twenty-first dielectric layer of the multilayer structure of the balun of FIG. 6.

The multilayer structure 50 will be described in detail with reference to FIG. 7 to FIG. 14C. The multilayer structure 50 includes 21 dielectric layers stacked on each other. The 21 dielectric layers will be referred to as the first to twenty-first dielectric layers in the order from bottom to top. FIG. 7 is a perspective view illustrating the interior of the multilayer structure 50. FIG. 8 is a perspective view illustrating a part of the interior of the multilayer structure 50. FIGS. 9A to 9C illustrate the respective patterned surfaces of the first to third dielectric layers. FIG. 10A illustrates the patterned surface of each of the fourth to seventh dielectric layers. FIG. 10B illustrates the patterned surface of the eighth dielectric layer. FIGS. 11A and 11B illustrate the respective patterned surfaces of the ninth and tenth dielectric layers. FIG. 12A illustrates the patterned surface of the eleventh dielectric layer. FIG. 12B illustrates the patterned surface of each of the twelfth and thirteenth dielectric layers. FIG. 12C illustrates the patterned surface of the fourteenth dielectric layer. FIG. 13A illustrates the patterned surface of the fifteenth dielectric layer. FIG. 13B illustrates the patterned surface of the sixteenth dielectric layer. FIG. 13C illustrates the patterned surface of each of the seventeenth and eighteenth dielectric layers. FIGS. 14A to 14C illustrate the respective patterned surfaces of the nineteenth to twenty-first dielectric layers.

As shown in FIG. 9A, the first to sixth terminals 111, 112, 113, 114, 115 and 116 are formed on the patterned surface of the first dielectric layer 51. Further, through holes 51T1, 51T2, 51T3, 51T4, 51 T5 and 51T6 are formed in the dielectric layer 51 and connected to the terminals 111, 112, 113, 114, 115 and 116, respectively.

As shown in FIG. 9B, a conductor layer 521 is formed on the patterned surface of the second dielectric layer 52. The conductor layer 521 is used for forming the first capacitor C1. Further, through holes 52T2, 52T3, 52T4, 52T5 and 52T6 are formed in the dielectric layer 52. The through holes 51T2 to 51T6 shown in FIG. 9A are connected to the through holes 52T2 to 52T6, respectively. The through hole 51T1 shown in FIG. 9A is connected to the conductor layer 521.

As shown in FIG. 9C, a conductor layer 531 is formed on the patterned surface of the third dielectric layer 53. The conductor layer 531 is used for forming the first capacitor C1. Further, through holes 53T1, 53T2, 53T3, 53T4, 53T5 and 53T6 are formed in the dielectric layer 53. The through hole 53T1 is connected to the conductor layer 531. The through holes 52T2 to 52T6 shown in FIG. 9B are connected to the through holes 53T2 to 53T6, respectively.

As shown in FIG. 10A, through holes 54T1, 54T2, 54T3, 54T4, 54T5 and 54T6 are formed in each of the fourth to seventh dielectric layers 54, 55, 56 and 57. In the dielectric layers 54 to 57, every vertically adjacent through holes denoted by the same reference signs are connected to each other. The through holes 53T1 to 53T6 shown in FIG. 9C are respectively connected to the through holes 54T1 to 54T6 formed in the dielectric layer 54.

As shown in FIG. 10B, through holes 58T1, 58T2, 58T3, 58T4, 58T5 and 58T6 are formed in the eighth dielectric layer 58. The through holes 54T1 to 54T6 formed in the dielectric layer 57 of FIG. 10A are connected to the through holes 58T1 to 58T6, respectively.

As shown in FIG. 11A, a conductor layer 591 is formed on the patterned surface of the ninth dielectric layer 59. The conductor layer 591 is used for forming the main line 10. The conductor layer 591 has a first end and a second end. Further, through holes 59T3, 59T4, 59T5 and 59T6 are formed in the dielectric layer 59. The through holes 58T3 to 58T6 shown in FIG. 10B are connected to the through holes 59T3 to 59T6, respectively. The through hole 58T1 shown in FIG. 10B is connected to a portion of the conductor layer 591 near the first end thereof. The through hole 58T2 shown in FIG. 10B is connected to a portion of the conductor layer 591 near the second end thereof.

As shown in FIG. 11B, a conductor layer 601 is formed on the patterned surface of the tenth dielectric layer 60. The conductor layer 601 is used for forming the subline 20. The conductor layer 601 has a first end and a second end. Further, through holes 60T4, 60T5, 60T6 and 60T7 are formed in the dielectric layer 60. The through holes 59T4 to 59T6 shown in FIG. 11A are connected to the through holes 60T4 to 60T6, respectively. The through hole 60T7 is connected to a portion of the conductor layer 601 near the second end thereof. The through hole 59T3 shown in FIG. 11A is connected to a portion of the conductor layer 601 near the first end thereof.

As shown in FIG. 12A, a conductor layer 611 is formed on the patterned surface of the eleventh dielectric layer 61. Further, through holes 61T4, 61T5, 61T6 and 61T7 are formed in the dielectric layer 61. The through holes 60T4 to 60T6 shown in FIG. 11B are connected to the through holes 61T4 to 61T6, respectively. The through hole 60T7 shown in FIG. 11B and the through hole 61T7 are connected to the conductor layer 611.

As shown in FIG. 12B, through holes 62T4, 62T5, 62T6 and 62T7 are formed in each of the twelfth and thirteenth dielectric layers 62 and 63. In the dielectric layers 62 and 63, every vertically adjacent through holes denoted by the same reference signs are connected to each other. The through holes 61T4 to 61T7 shown in FIG. 12A are respectively connected to the through holes 62T4 to 62T7 formed in the dielectric layer 62.

As shown in FIG. 12C, through holes 64T4, 64T5, 64T6 and 64T7 are formed in the fourteenth dielectric layer 64. The through holes 62T4 to 62T7 formed in the dielectric layer 63 of FIG. 12B are connected to the through holes 64T4 to 64T7, respectively.

As shown in FIG. 13A, conductor layers 651 and 652 are formed on the patterned surface of the fifteenth dielectric layer 65. The conductor layer 651 is used for forming the second capacitor C2. Further, through holes 65T4 and 65T7 are formed in the dielectric layer 65. The through hole 64T4 shown in FIG. 12C is connected to the through hole 65T4. The through hole 64T7 shown in FIG. 12C and the through hole 65T7 are connected to the conductor layer 652. The through holes 64T5 and 64T6 shown in FIG. 12C are connected to the conductor layer 651.

As shown in FIG. 13B, a conductor layer 661 is formed on the patterned surface of the sixteenth dielectric layer 66. The conductor layer 661 is used for forming the second capacitor C2. Further, through holes 66T4, 66T7 and 66T8 are formed in the dielectric layer 66. The through holes 65T4 and 65T7 shown in FIG. 13A are connected to the through holes 66T4 and 66T7, respectively. The through hole 66T8 is connected to the conductor layer 661.

As shown in FIG. 13C, through holes 67T4, 67T7 and 67T8 are formed in each of the seventeenth and eighteenth dielectric layers 67 and 68. In the dielectric layers 67 and 68, every vertically adjacent through holes denoted by the same reference signs are connected to each other. The through holes 66T4, 66T7 and 66T8 shown in FIG. 13B are respectively connected to the through holes 67T4, 67T7 and 67T8 formed in the dielectric layer 67.

As shown in FIG. 14A, a conductor layer 691 is formed on the patterned surface of the nineteenth dielectric layer 69. The conductor layer 691 is used for forming the first inductance element L1. The conductor layer 691 has a first end and a second end. Further, through holes 69T4 and 69T8 are formed in the dielectric layer 69. The through hole 67T4 formed in the dielectric layer 68 of FIG. 13C is connected to the through hole 69T4. The through hole 67T8 formed in the dielectric layer 68 of FIG. 13C and the through hole 69T8 are connected to a portion of the conductor layer 691 near the second end thereof. The through hole 67T7 formed in the dielectric layer 68 of FIG. 13C is connected to a portion of the conductor layer 691 near the first end thereof.

As shown in FIG. 14B, a conductor layer 701 is formed on the patterned surface of the twentieth dielectric layer 70. The conductor layer 701 is used for forming the second inductance element L2. The conductor layer 701 has a first end and a second end. The through hole 69T4 shown in FIG. 14A is connected to a portion of the conductor layer 701 near the first end thereof. The through hole 69T8 shown in FIG. 14A is connected to a portion of the conductor layer 701 near the second end thereof.

As shown in FIG. 14C, a mark 711 is formed on the patterned surface of the twenty-first dielectric layer 71.

The multilayer structure 50 shown in FIG. 6 is formed by stacking the first to twenty-first dielectric layers 51 to 71 such that the patterned surface of the first dielectric layer 51 also serves as the bottom surface 50B of the multilayer structure 50. FIG. 7 illustrates the interior of the multilayer structure 50. FIG. 7 omits the mark 711. FIG. 8 illustrates a part of the interior of the multilayer structure 50.

Now, a description will be given of correspondences of the circuit components of the balun 1 shown in FIG. 1 and the first example circuit components of the impedance matching section 30 shown in FIG. 2 with the components inside the multilayer structure 50 shown in FIGS. 9A to 14C. The main line 10 is formed of the conductor layer 591 shown in FIG. 11A. The portion of the conductor layer 591 near the first end thereof is connected to the conductor layer 531 shown in FIG. 9C via the through holes 53T1, 54T1 and 58T1. The portion of the conductor layer 591 near the second end thereof is connected to the second terminal 112 via the through holes 51T2, 52T2, 53T2, 54T2 and 58T2.

The subline 20 is formed of the conductor layer 601 shown in FIG. 11B. The portion of the conductor layer 601 near the first end thereof is connected to the third terminal 113 via the through holes 51T3, 52T3, 53T3, 54T3, 58T3 and 59T3. The portion of the conductor layer 601 near the second end thereof is connected to the conductor layer 691 shown in FIG. 14A via the through hole 60T7, the conductor layer 611, the through holes 61T7, 62T7 and 64T7, the conductor layer 652, and the through holes 65T7, 66T7 and 67T7.

The first capacitor C1 is foil led of the conductor layers 521 and 531 shown in FIGS. 9B and 9C, and the dielectric layer 52 interposed between the conductor layers 521 and 531. The conductor layer 521 is connected to the first terminal 111 via the through hole 51T1. The conductor layer 531 is connected via the through holes 53T1, 54T1 and 58T1 to the conductor layer 591 forming the main line 10.

The first inductance element L1 is formed of the conductor layer 691 shown in FIG. 14A. The portion of the conductor layer 691 near the first end thereof is connected to the conductor layer 601 forming the subline 20 via the through hole 60T7, the conductor layer 611, the through holes 61T7, 62T7 and 64T7, the conductor layer 652, and the through holes 65T7, 66T7 and 67T7. The portion of the conductor layer 691 near the second end thereof is connected to the conductor layer 661 shown in FIG. 13B via the through holes 66T8 and 67T8, and also connected to the conductor layer 701 shown in FIG. 14B via the through hole 69T8. The junction between the conductor layer 691 and the through hole 67T7 formed in the dielectric layer 68 corresponds to the first end L1a of the first inductance element L1. The junction between the conductor layer 691 and the through hole 67T8 formed in the dielectric layer 68 corresponds to the second end L1b of the first inductance element L1.

The second inductance element L2 is formed of the conductor layer 701 shown in FIG. 14B. The portion of the conductor layer 701 near the first end thereof is connected to the fourth terminal 114 via the through holes 51T4, 52T4, 53T4, 54T4, 58T4, 59T4, 60T4, 61T4, 62T4, 64T4, 65T4, 66T4, 67T4 and 69T4. The portion of the conductor layer 701 near the second end thereof is connected via the through hole 69T8 to the conductor layer 691 forming the first inductance element L1. The junction between the conductor layer 701 and the through hole 69T4 corresponds to the first end L2a of the second inductance element L2. The junction between the conductor layer 701 and the through hole 69T8 corresponds to the second end L2b of the second inductance element L2.

The second capacitor C2 is formed of the conductor layers 651 and 661 shown in FIGS. 13A and 13B and the dielectric layer 65 interposed between the conductor layers 651 and 661. The conductor layer 651 is connected to the fifth and sixth terminals 115 and 116 via the through holes 51T5, 51T6, 52T5, 52T6, 53T5, 53T6, 54T5, 54T6, 58T5, 58T6, 59T5, 59T6, 60T5, 60T6, 61T5, 61T6, 62T5, 62T6, 64T5 and 64T6. The conductor layer 661 is connected via the through holes 66T8 and 67T8 to the conductor layer 691 forming the first inductance element L1.

As previously mentioned, in the first example of the impedance matching section 30, the first inductance element L1 is the first line and the second inductance element L2 is the second line. The first line is formed of the conductor layer 691 shown in FIG. 14A. The second line is formed of the conductor layer 701 shown in FIG. 14B.

The first line includes a first line portion 31A. In FIG. 14A the first line portion 31A is shown with hatching. The first line portion 31A has a first edge 31Aa and a second edge 31Ab opposite to each other, the first edge 31Aa being closest to the subline 20 in terms of circuit configuration. The first edge 31Aa is located near the first end L1a of the first inductance element L1. The second edge 31Ab is located near the second end L1b of the first inductance element L1.

The second line includes a second line portion 31B opposed to the first line portion 31A. In FIG. 14B the second line portion 31B is shown with hatching. The second line portion 31B has a first edge 31Ba and a second edge 31Bb opposite to each other, the first edge 31Ba being closest to the second balanced port 22 in terms of circuit configuration. The first edge 31Ba is located near the first end L2a of the second inductance element L2. The second edge 31Bb is located near the second end L2b of the second inductance element L2.

As shown in FIGS. 14A and 14B, the first edge 31Ba of the second line portion 31B is physically closer to the second edge 31Ab of the first line portion 31A than to any other part of the first line portion 31A. The second edge 31Bb of the second line portion 31B is physically closer to the first edge 31Aa of the first line portion 31A than to any other part of the first line portion 31A.

The operation and effects of the balun 1 according to this embodiment will now be described. In the balun 1, the unbalanced port 11 is used to input and output an unbalanced signal, the first balanced port 21 is used to input and output a first balanced element signal, and the second balanced port 22 is used to input and output a second balanced element signal. The first balanced element signal and the second balanced element signal constitute a balanced signal. The balun 1 converts between the balanced signal and the unbalanced signal.

The subline 20 and the impedance matching section 30 are designed to provide a phase difference of 180 or near 180 degrees between the first and second balanced element signals to be outputted from the first and second balanced ports 21 and 22 upon input of an unbalanced signal to the unbalanced port 11 in the usable frequency band of the balun 1. For example, each of the main line 10 and the subline 20 may be a line having a length equivalent to one-half or approximately one-half of a wavelength that corresponds to a predetermined frequency within the usable frequency band of the balun 1. In such a case, the impedance matching section 30 may be designed to cause a 360- or near 360-degree change in the phase of a signal of the aforementioned predetermined frequency when the signal passes through the impedance matching section 30.

In the balun 1 according to the embodiment, a series resonant circuit is formed by the main line 10 and the first capacitor C1. This enables creation of an attenuation pole in the reflection characteristic of the balun 1 by means of resonance of the series resonant circuit. The frequency at which the attenuation pole occurs, that is, the resonant frequency of the series resonant circuit, is preferably adjusted to fall within the usable frequency band of the balun 1. By virtue of the creation of the attenuation pole in the reflection characteristic of the balun 1, this embodiment provides a good pass characteristic and a good reflection characteristic over a wider frequency band as compared with Marchand baluns. The embodiment thus enables the balun 1 to be capable of being used over a wide frequency band.

In the balun 1 according to the embodiment, possible configurations of the impedance matching section 30 are not limited to the foregoing first to fourth examples. The impedance matching section 30 can have any other various configurations that enable the impedance matching section 30 to perform the impedance matching function and the phase changing function. The embodiment thus offers a wide range of design possibilities for the impedance matching section 30 and the balun 1, which may be appropriately selected according to the characteristic, shape and other conditions required of the balun 1.

The effects of the balun 1 according to the embodiment will now be described in more detail with reference to the results of a simulation comparing characteristics between the balun 1 according to the embodiment and a comparative example balun 201. The comparative example balun 201 is a Marchand balun.

Figure 15:
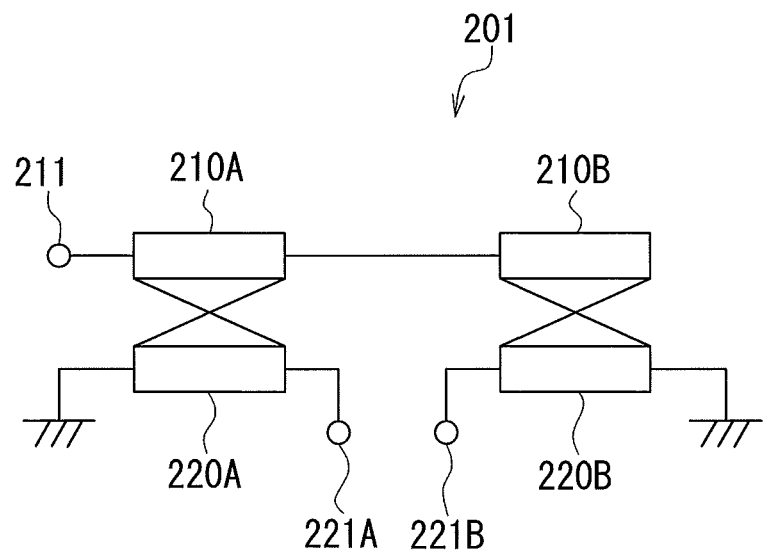
FIG. 15 is a circuit diagram illustrating the circuit configuration of a comparative example balun.

FIG. 15 is a circuit diagram illustrating the circuit configuration of the comparative example balun 201. As shown in FIG. 15, the comparative example balun 201 includes an unbalanced port 211, a first balanced port 221A, a second balanced port 221B, a first unbalanced transmission line 210A, a second unbalanced transmission line 210B, a first balanced transmission line 220A and a second balanced transmission line 220B.

The first unbalanced transmission line 210A and the second unbalanced transmission line 210B are connected in series. The first balanced transmission line 220A is configured to be electromagnetically coupled to the first unbalanced transmission line 210A. The second balanced transmission line 220B is configured to be electromagnetically coupled to the second unbalanced transmission line 210B.

One end of the first unbalanced transmission line 210A is connected to the unbalanced port 211. The other end of the first unbalanced transmission line 210A is connected to one end of the second unbalanced transmission line 210B.

One end of the first balanced transmission line 220A is connected to the first balanced port 221A. One end of the second balanced transmission line 220B is connected to the second balanced port 221B. The other end of the first balanced transmission line 220A and the other end of the second balanced transmission line 220B are connected to the ground.

For the simulation, the baluns 1 and 201 were designed so that the center frequencies of the passbands of the baluns 1 and 201 were equal. In the simulation, the reflection characteristics, pass characteristics, amplitude balance characteristics and phase balance characteristics of the baluns 1 and 201 were determined.

Figure 16:
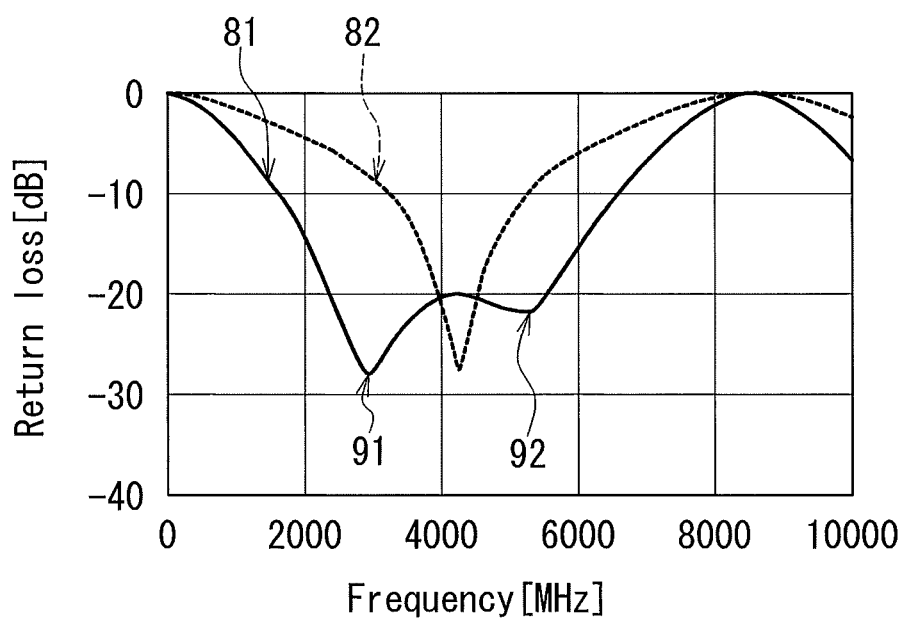
FIG. 16 is a characteristic diagram illustrating an example of reflection characteristics of the balun according to the embodiment of the invention and the comparative example balun.

FIG. 16 illustrates an example of the reflection characteristics of the baluns 1 and 201. The reflection characteristics of the baluns are represented here using a single-ended S-parameter representing the response of a signal outputted from the unbalanced port upon input of an unbalanced signal to the unbalanced port. This S-parameter will hereinafter be referred to as return loss. In FIG. 16 the horizontal axis represents frequency, and the vertical axis represents return loss. In FIG. 16, line 81 represents the reflection characteristic of the balun 1, and line 82 represents the reflection characteristic of the balun 201.

As shown in FIG. 16, the reflection characteristic 82 of the balun 201 shows one attenuation pole in the frequency range on the horizontal axis of FIG. 16. On the other hand, the reflection characteristic 81 of the balun 1 shows two attenuation poles, i.e., a first attenuation pole 91 and a second attenuation pole 92, in the frequency range on the horizontal axis of FIG. 16. The first attenuation pole 91 results from the resonance of the series resonant circuit formed by the main line 10 and the first capacitor C1. The second attenuation pole 92 results from the resonance of a portion of the balun 1 constituted of the main line 10, the subline 20 and the impedance matching section 30.

It is required of baluns to have such a reflection characteristic that when the return loss value is denoted as −R dB, the value of R be sufficiently large over a wide frequency band. For the reflection characteristic 81 of the balun 1, the value of R is sufficiently large over a wide frequency band by virtue of the presence of the two attenuation poles 91 and 92. For example, when the widths of the frequency bands over which the value of R is 3 or more are compared between the reflection characteristics 81 and 82, the reflection characteristic 81 of the balun 1 clearly shows a larger width than the reflection characteristic 82 of the balun 201. It can thus be said that the reflection characteristic 81 of the balun 1 is good over a wider frequency band than the reflection characteristic 82 of the balun 201.

Figure 17:
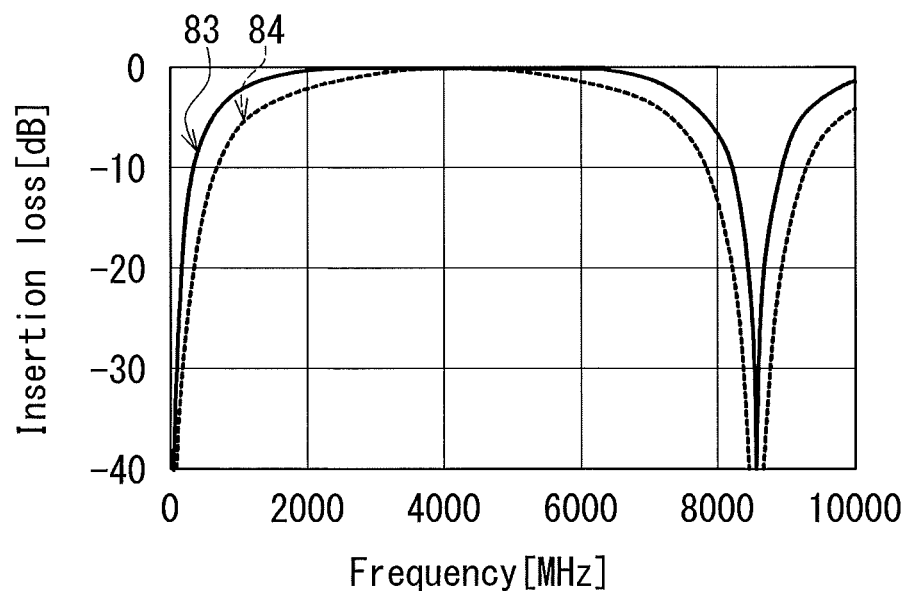
FIG. 17 is a characteristic diagram illustrating an example of pass characteristics of the balun according to the embodiment of the invention and the comparative example balun.

FIG. 17 illustrates an example of the pass characteristics of the baluns 1 and 201. The pass characteristics of the baluns are represented here using a mixed-mode S-parameter representing the response of a difference signal of two balanced element signals outputted from the two balanced ports upon input of an unbalanced signal to the unbalanced port. This S-parameter will hereinafter be referred to as insertion loss. In FIG. 17 the horizontal axis represents frequency, and the vertical axis represents insertion loss. In FIG. 17, line 83 represents the pass characteristic of the balun 1, and line 84 represents the pass characteristic of the balun 201.

It is required of baluns to have such a pass characteristic that when the insertion loss value is denoted as −I dB, the value of I be sufficiently small over a wide frequency band. For example, when the widths of the frequency bands over which the value of I is 3 or less are compared between the pass characteristics 83 and 84, the pass characteristic 83 of the balun 1 clearly shows a larger width than the pass characteristic 84 of the balun 201. It can thus be said that the pass characteristic 83 of the balun 1 is good over a wider frequency band than the pass characteristic 84 of the balun 201. This effect results from the presence of the two attenuation poles 91 and 92 in the reflection characteristic 81 of the balun 1 as described above.

Figure 18:
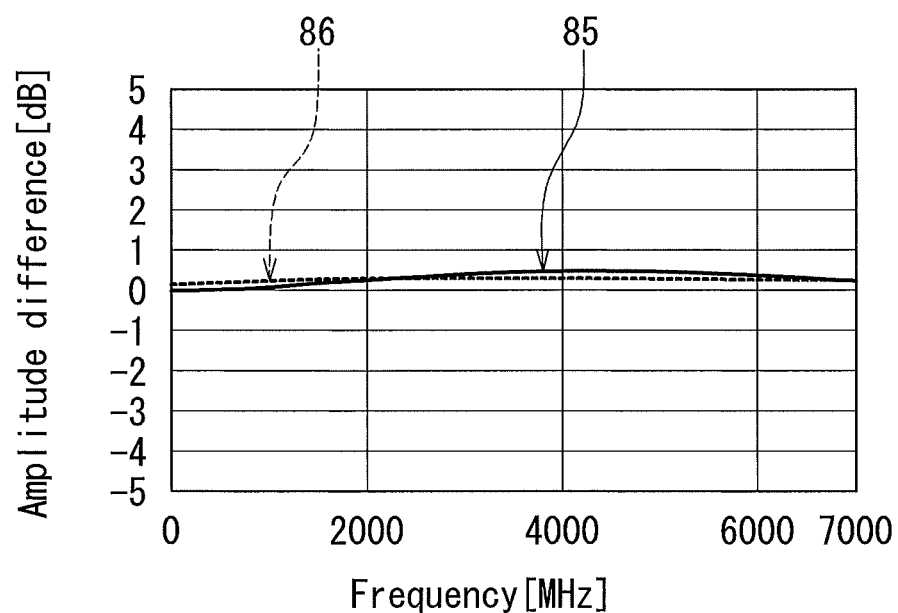
FIG. 18 is a characteristic diagram illustrating an example of amplitude balance characteristics of the balun according to the embodiment of the invention and the comparative example balun.

FIG. 18 illustrates an example of amplitude balance characteristics of the baluns 1 and 201. The amplitude balance characteristics of the baluns are represented here using a difference in amplitude between the two balanced element signals outputted from the two balanced ports upon input of an unbalanced signal to the unbalanced port, which will hereinafter be simply referred to as the amplitude difference. The amplitude difference is expressed in positive values when the amplitude of the first balanced element signal is greater than the amplitude of the second balanced element signal, and in negative values when the amplitude of the first balanced element signal is smaller than the amplitude of the second balanced element signal. In FIG. 18 the horizontal axis represents frequency, and the vertical axis represents amplitude difference. In FIG. 18, line 85 represents the amplitude balance characteristic of the balun 1, and line 86 represents the amplitude balance characteristic of the balun 201.

In the frequency range on the horizontal axis of FIG. 18, the amplitude differences for the baluns 1 and 201 are both close to 0 (dB). Thus, the amplitude balance characteristic 85 of the balun 1 and the amplitude balance characteristic 86 of the balun 201 are both good in the frequency range on the horizontal axis of FIG. 18.

Figure 19:
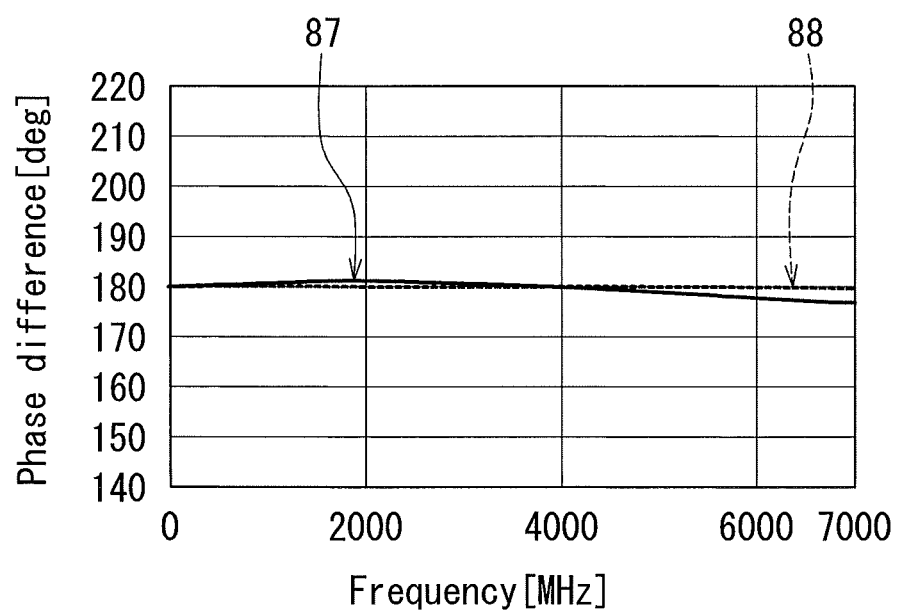
FIG. 19 is a characteristic diagram illustrating an example of phase balance characteristics of the balun according to the embodiment of the invention and the comparative example balun.

FIG. 19 illustrates an example of phase balance characteristics of the baluns 1 and 201. The phase balance characteristics of the baluns are represented here using a difference in phase between the two balanced element signals outputted from the two balanced ports upon input of an unbalanced signal to the unbalanced port, which will hereinafter be simply referred to as the phase difference. The phase difference represents the magnitude of advancement of the phase of the first balanced element signal relative to the phase of the second balanced element signal. In FIG. 19 the horizontal axis represents frequency, and the vertical axis represents phase difference. In FIG. 19, line 87 represents the phase balance characteristic of the balun 1, and line 88 represents the phase balance characteristic of the balun 201.

In the frequency range on the horizontal axis of FIG. 19, the phase differences for the baluns 1 and 201 are both close to 180 degrees. Thus, the phase balance characteristic 87 of the balun 1 and the phase balance characteristic 88 of the balun 201 are both good in the frequency range on the horizontal axis of FIG. 19.

As can be seen from FIG. 16 and FIG. 17, the balun 1 according to the embodiment provides a good pass characteristic and a good reflection characteristic over a wider frequency band when compared with the comparative example balun 201, i.e., a Marchand balun. The usable frequency band of the balun 1 in the example shown in FIGS. 16 to 19 includes at least the 1000 to 7000 MHz (1 to 7 GHz) frequency band.

The present invention is not limited to the foregoing embodiment, and various modifications may be made thereto. For example, for the impedance matching section 30, the configuration of FIG. 2 may be modified to further include a third path connecting the first end L1a of the first inductance element L1 and the first end L2a of the second inductance element L2. The third path includes a third capacitor which is a lumped constant element. In such a case, the first line (the first inductance element L1) and the second line (the second inductance element L2) may or may not be configured to be capacitively coupled to each other such that the capacitance between the first line and the second line is distributed continuously along the first and second lines. Alternatively, the impedance matching section 30 may be a delay line formed of a line.

Obviously, many modifications and variations of the present invention are possible in the light of the above teachings. Thus, it is to be understood that, within the scope of the appended claims and equivalents thereof, the invention may be practiced in other than the foregoing most preferable embodiment.

What is claimed is:

1. A balun comprising:
   an unbalanced port;
   a first balanced port;
   a second balanced port;
   a main line having a first end and a second end opposite to each other, the second end of the main line being connected to a ground;
   a subline configured to be electromagnetically coupled to the main line and having a first end and a second end opposite to each other, the first end of the subline being directly connected to the first balanced port;
   a first capacitor provided between the first end of the main line and the unbalanced port; and
   an impedance matching section provided between the second end of the subline and the second balanced port, wherein
   the impedance matching section includes a first path connecting the second end of the subline and the second balanced port, and a second path connecting the first path and the ground,
   the first path includes an inductor, and
   the second path includes a second capacitor.

2. The balun according to claim 1, further comprising a multilayer structure for integrating the unbalanced port, the first and second balanced ports, the main line, the subline, the first capacitor and the impedance matching section, the multilayer structure including a plurality of dielectric layers and a plurality of conductor layers stacked on each other.

3. A balun comprising:
   an unbalanced port;
   a first balanced port;
   a second balanced port;
   a main line having a first end and a second end opposite to each other, the second end of the main line being connected to a ground;
   a subline configured to be electromagnetically coupled to the main line and having a first end and a second end opposite to each other, the first end of the subline being directly connected to the first balanced port;
   a first capacitor provided between the first end of the main line and the unbalanced port; and
   an impedance matching section provided between the second end of the subline and the second balanced port, wherein
   the impedance matching section includes a first path connecting the second end of the subline and the second balanced port, and a second path connecting the first path and the ground,
   the first path includes a first inductance element and a second inductance element having their respective inductances and configured to be inductively coupled to each other,
   each of the first and second inductance elements has a first end and a second end opposite to each other,
   the first end of the first inductance element is connected to the second end of the subline,
   the first end of the second inductance element is connected to the second balanced port, the second end of the first inductance element and the second end of the second inductance element are connected to each other, and connected to the ground via the second path, and the second path includes a second capacitor.

4. The balun according to claim 3, further comprising a multilayer structure for integrating the unbalanced port, the first and second balanced ports, the main line, the subline, the first capacitor and the impedance matching section, the multilayer structure including a plurality of dielectric layers and a plurality of conductor layers stacked on each other.

5. The balun according to claim 3, wherein the first inductance element is a first line, and the second inductance element is a second line.

6. The balun according to claim 5, wherein the first line and the second line are configured to be capacitively coupled to each other.

7. The balun according to claim 5, wherein the first line includes a first line portion, the second line includes a second line portion opposed to the first line portion, the first line portion has a first edge and a second edge opposite to each other, the first edge of the first line portion being closest to the second end of the subline in circuit configuration, the second line portion has a first edge and a second edge opposite to each other, the first edge of the second line portion being closest to the second balanced port in circuit configuration, the first edge of the second line portion is physically closer to the second edge of the first line portion than to any other part of the first line portion, and the second edge of the second line portion is physically closer to the first edge of the first line portion than to any other part of the first line portion.

8. A balun comprising:

an unbalanced port;

a first balanced port;

a second balanced port;

a main line having a first end and a second end opposite to each other, the second end of the main line being connected to a ground;

a subline configured to be electromagnetically coupled to the main line and having a first end and a second end opposite to each other, the first end of the subline being connected to the first balanced port;

a first capacitor provided between the first end of the main line and the unbalanced port; and an impedance matching section provided between the second end of the subline and the second balanced port, the impedance matching section including:

a first path connecting the second end of the subline and the second balanced port, the first path including:

a first inductance element having a first inductance, the first inductance element including:

a first end connected to the second end of the subline; and a second end opposite to the first end of the first inductance element; and a second inductance element having a second inductance, and configured to be inductively coupled to the first inductance element, the second inductance element including:

a first end connected to the second balanced port; and a second end opposite to the first end of the second inductance element, the second end of the second inductance element being connected to the second end of the first inductance element; and a second path connecting the first path and the ground, the second path including a second capacitor, wherein the second end of the first inductance element and the second end of the second inductance element are connected to the ground via the second path.

9. The balun according to claim 8, wherein the first inductance element is a first line, and the second inductance element is a second line.

10. The balun according to claim 9, wherein the first line and the second line are configured to be capacitively coupled to each other.

11. The balun according to claim 9, wherein the first line includes a first line portion, the second line includes a second line portion opposed to the first line portion, the first line portion has a first edge and a second edge opposite to each other, the first edge of the first line portion being closest to the second end of the subline in circuit configuration, the second line portion has a first edge and a second edge opposite to each other, the first edge of the second line portion being closest to the second balanced port in circuit configuration, the first edge of the second line portion is physically closer to the second edge of the first line portion than to any other part of the first line portion, and the second edge of the second line portion is physically closer to the first edge of the first line portion than to any other part of the first line portion.

* * * * *